United States Patent [19]

Ito et al.

[11] Patent Number: 4,556,814

[45] Date of Patent: Dec. 3, 1985

[54] PIEZOELECTRIC ULTRASONIC TRANSDUCER WITH POROUS PLASTIC HOUSING

[75] Inventors: Toshiharu Ito; Eiji Ozeki; Kozo Okada, all of Nagoya, Japan

[73] Assignee: NGK Spark Plug Co., Ltd., Japan

[21] Appl. No.: 659,281

[22] Filed: Oct. 10, 1984

[30] Foreign Application Priority Data

| | | | |
|---|---|---|---|
| Feb. 21, 1984 | [JP] | Japan | 59-24346 |
| Feb. 24, 1984 | [JP] | Japan | 59-26487 |
| Apr. 6, 1984 | [JP] | Japan | 59-50347 |

[51] Int. Cl.[4] .................... H01L 41/08

[52] U.S. Cl. .................... 310/334; 310/326; 73/644

[58] Field of Search .................... 310/334–337, 310/89, 43; 73/642, 644, 861.18, 861.27, 861.28; 206/305, 328, 524.1, 524.3, 524.6, 819

[56] References Cited

U.S. PATENT DOCUMENTS

| | | | |
|---|---|---|---|
| 2,908,161 | 10/1959 | Bincer | 310/336 X |
| 3,209,582 | 10/1965 | Greenberg et al. | 310/336 X |
| 3,883,841 | 5/1975 | Norel | 310/336 X |
| 3,928,777 | 12/1975 | Massa | 310/334 X |
| 3,946,599 | 3/1976 | Patt | 310/336 X |
| 4,373,401 | 2/1983 | Baumoel | 310/334 X |

*Primary Examiner*—Mark O. Budd

*Attorney, Agent, or Firm*—Darby & Darby

[57] ABSTRACT

An improved ultrasonic transducer including an oscillation housing composed of a cylindrical side plate and a wave transmitting and receiving top plate provided at one end of the side plate, a piezoelectric element integrally bonded to the inside of the top plate for oscillation therewith, and electrodes arranged on the piezoelectric element so that ultrasonic waves may be generated from the top plate when an electric field is applied to the electrodes and/or an electric output is delivered from the electrodes when the top plate receives ultrasonic waves. The improvement includes the oscillation housing which is formed, at least in its top plate, of a porous plastic material.

9 Claims, 17 Drawing Figures

PIEZOELECTRIC ULTRASONIC TRANSDUCER WITH POROUS PLASTIC HOUSING

This invention relates to an ultrasonic transducer capable of transmitting and/or receiving ultrasonic waves.

There are known various types of ultrasonic transducers in the art. One such transducer is shown in FIG. 15 in which the reference numeral 1 designates an oscillation housing formed of a metal such as a stainless steel and composed of a cylindrical side plate 1*b* and a top plate 1*a* provided at one end of the side plate 1*b* for closing same. Designated as 2 is a piezoelectric ceramic disc integrally bonded to the inside wall of the top plate 1*a* for oscillation therewith. The ceramic disc 2 has its opposite sides provided with a pair of electrodes 2*a* and 2*b*. The open end portion of the oscillation housing 1 is closed by a cover plate 3. Provided in the cover plate 3 are a pair of terminal pins 4*a* and 4*b* whose one ends are connected by lead wires 5*a* and 5*b* with the electrodes 2*a* and 2*b* , respectively. Indicated as 6 is an insulating layer formed of, for example, an epoxy resin for sealing the oscillation housing 1.

When an electric field is applied to the terminal pins 4*a* and 4*b* for impressing an AC voltage between the opposite electrodes 2*a* and 2*b*, the piezoelectric ceramic disc 2 is excited in the thickness mode or the bending mode so that an ultrasonic wave is generated from the top plate 1*a* which is integrally bonded to the ceramic disc 2. On the other hand, if the top plate 1*a* receives an ultrasonic wave, the piezoelectric ceramic disc 2 deforms so that an output having an intensity corresponding to the incident ultrasonic wave is delivered from the electrodes 2*a* and 2*b*.

The ultrasonic transducer of the above mentioned type, however, is found to be illsuited for use as a proximity switch or a detector of the proximity of a substance. Since the oscillation housing is formed of a metal, the wave transmitting and receiving portion constituted from the top plate 1*a* and the piezoelectric ceramic disc 2 has a high mechanical quality factor $Q_m$ so that, as shown in FIG. 16*a*, the transducer shows pulse characteristics having a long pulse fall time. Therefore, there is a possibility that the transducer receives an ultrasonic wave, which has been reflected from the proximate substance, during the transmitting of the ultrasonic wave, unabling to operate as the detector.

It has been found that when the oscillation housing is formed of a plastic material such as an epoxy resin, the $Q_m$ of the wave transmitting and receiving portion becomes low and both the pulse rise time and pulse fall time become short as shown in FIG. 16*b*. Moreover, an improvement of the intensity of the output voltage delivered in response to the receipt of the ultrasonic wave also results.

Upon further studies, it has now been found that when the top plate of the oscillation housing is formed of a porous plastic material such as a foamed epoxy resin, the resulting transducer has superior wave transmitting and receiving properties, especially more improved responsibility, as compared with the transducer whose oscillation housing is formed of a non-porous plastic material.

In accordance with the present invention there is provided an ultrasonic transducer comprising an oscillation housing member having a cylindrical side plate and a wave transmitting and receiving top plate provided at one end of said side plate, a piezoelectric element integrally bonded to the inside wall of said top plate, and electrodes arranged on said piezoelectric element so that ultrasonic waves may be generated from said top plate when an electric field is applied to said electrodes and/or an electric output is delivered from said electrodes when said top plate receives ultrasonic waves, said top plate being formed of a porous plastic material.

The preferred embodiments of ultrasonic transducer in accordance with the present invention will now be described with reference to the accompanying drawings, in which.

Figure 1:
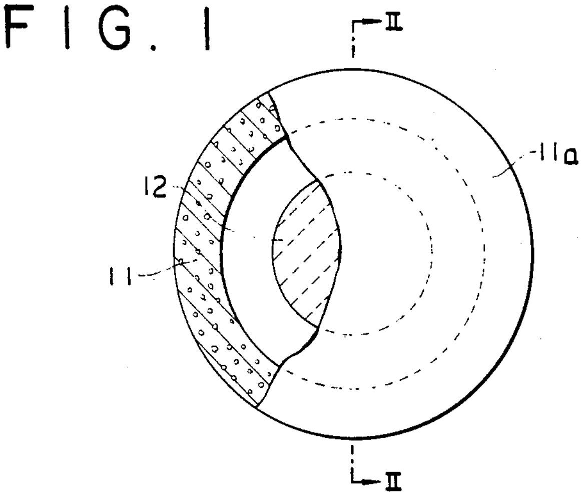
FIG. 1 is a plan view, cut away in part, diagrammatically showing one embodiment of the ultrasonic transducer of the present invention.
Figure 2:
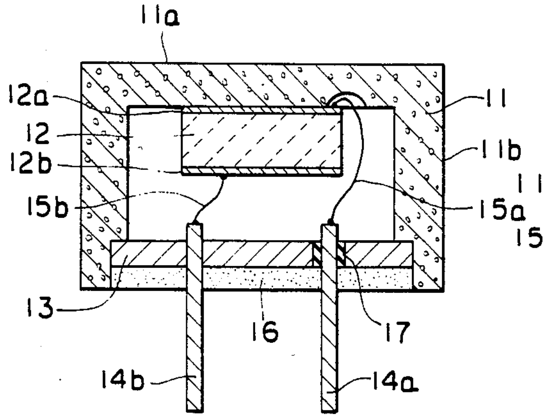
FIG. 2 is a cross-sectional, elevational view taken along the line II—II of FIG. 1.
Figure 15:
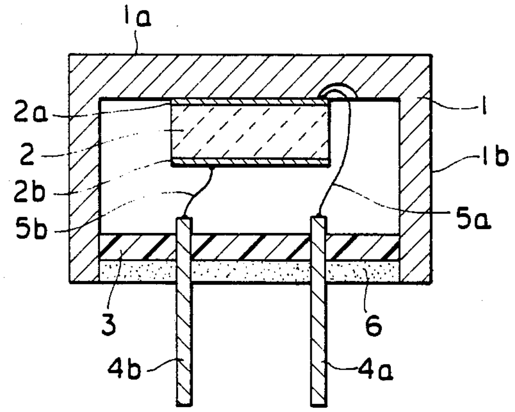
FIG. 15 PRIOR ART
FIG. 15 is cross-sectional, elevational view showing the conventional ultrasonic transducer.

FIGS. 1 and 2 depict one embodiment of the ultrasonic transducer according to the present invention. In FIGS. 1 and 2 and succeeding Figures as well, components parts corresponding to those of FIG. 15 are designated by the same reference numerals as part of "10" series. The embodiment shown in FIGS. 1 and 2 differs from the conventional transducer shown in FIG. 15 in that the oscillation housing 11 of FIGS. 1 and 2 is formed of a porous plastic material.

A piezoelectric element 12 with electrodes 12*a* and 12*b* is integrally bonded to the inside surface of a top plate 11*a* of the housing member 11. The housing member 11 has a cylindrical side plate 11*b* to which is integrally provided with the top plate 11*a*. The housing member 11 has its open end portion provided with a cover plate 13 to which are mounted a pair of terminal pins 14*a* and 14*b*. Lead wires 15*a* and 15*b* extend between the electrode 12*a* and the terminal pin 14*a* and between the electrode 12*b* and the terminal pin 14*b*, respectively. The cover plate 13 is overlaid with an insulating layer 16. Indicated as 17 is an insulator provided when the cover plate is formed of an electric conductor for providing insulation between the two terminal pins 14*a* and 14*b*.

In the embodiment shown in FIGS. 1 and 2, both the top plate 11*a* and the side plate 11*b* are formed of a porous plastic material. The term "porous plastic material" used herein is intended to mean a synthetic polymeric material having a multiplicity of closed cells dispersed within the polymeric material. Illustrative of suitable porous plastic materials are synthetic polymeric materials having dispersed therewithin a multiplicity of glass micro-balloons and synthetic polymeric foamed materials prepared in the conventional manner using foaming agents. Preferably, the porous plastic material has an average pore diameter of between 50 and 100 microns. Examples of suitable polymeric materials include epoxy resins, polyolefin resins, styrene resins, acryl resins and vinyl chloride resins.

Figure 16A:
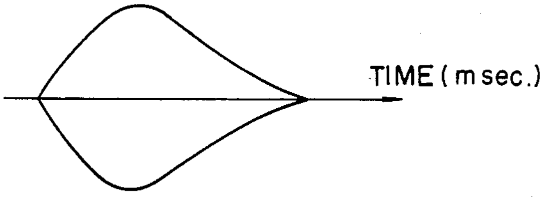
FIG. 16(a) PRIOR ART
FIGS. 16 (*a*) and 16 (*b*) are graphs showing pulse characteristics of the conventional transducer and of the present invention, respectively.
Figure 16B:
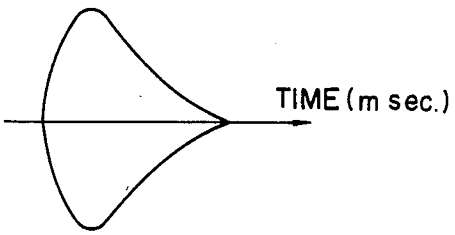

Because the oscillation housing member 11 of the present invention is formed of a porous plastic material, the $Q_m$ of the wave transmitting and receiving portion of the ultrasonic transducer of this invention is low so that the pulse rise time and the pulse fall time can be shortened as illustrated in FIG. 16 (*b*). The reduction of the pulse fall time advantageously results in the reduction of the reverberation time. Moreover, since the top plate 11*a* contains relatively a large amount of air, the acoustic impedance of the top plate 11*a* approaches to that of air. Therefore, the matching conditions between the top plate 11*a* and the ambient air is improved, resulting in the improvement in responsibility, i.e. a more intensive output is obtainable upon receipt of the ultrasonic wave of the same intensity.

For example, the conventional ultrasonic transducer whose housing is formed of a stainless steel gives a pulse rise time of 0.5 msec, a pulse fall time of 2.0 msec and an output voltage of 0.4 V. An ultrasonic transducer whose oscillation housing is formed of a non-porous epoxy resin gives a pulse rise time of 0.2 msec, a pulse fall time of 1.2 msec and an output voltage of 2.6 V. In the case of the ultrasonic transducer according to the present invention the oscillation housing of which is formed of an epoxy resin having dispersed therein a multiplicity of glass micro-balloons having a diameter of 50–100 microns, the pulse rise time and pulse fall time are 0.2 and 1.2 msec, respectively, and the output voltage is 6.4 V.

It is preferred that the thickness of the top plate 11*a* of the oscillation housing 11 be about a quarter of the wave length of the velocity of sound of the top plate 11*a* for reason of attaining best responsibility.

Figure 3:
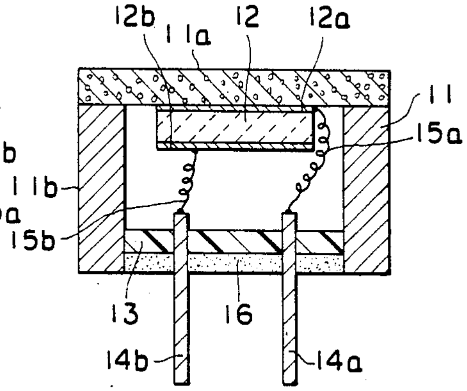
FIG. 3 is a cross-sectional, elevational view similar to FIG. 2 diagrammatically showing another embodiment of the present invention.
Figure 4:
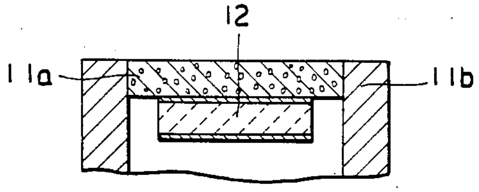
FIG. 4 is a fragmentary, cross-sectional, elevational view similar to FIG. 3 showing an alternate embodiment of FIG. 3.
Figure 5:
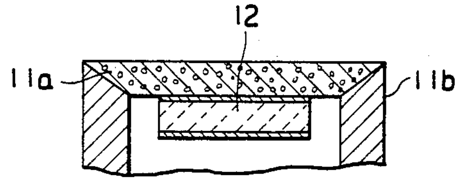
FIG. 5 is a view similar to FIG. 4 showing a further alternate embodiment of FIG. 3.

In the above embodiment, both of the top plate 11*a* and the cylindrical side plate 11*b* are formed of a porous plastic material. Similar improvement may be obtained even when the top plate alone is formed of a porous plastic material. Referring to FIG. 3, a cylindrical side plate 11*b* is, at its one end, integrally provided with a top plate 11*a* formed of a porous plastic material of a type just mentioned above. The other constructions of the transducer are substantially the same as in the embodiment of FIGS. 1 and 2 and the detailed explanation thereof is omitted here. FIGS. 4 and 5 depict embodiments similar to that of FIG. 3. In FIG. 4, the outer periphery of the top plate 11*a* is in contact with the inside surface of the cylindrical side plate 11*b*. In FIG. 5, the end portions of the top plate 11*a* and the side plate 11*b* are cut diagonally for abutting engagement with each other. The fixation of the top plate 11*a* to the side plate 11*b* may be done by any known means such as adhesives.

In the embodiments shown in FIGS. 3 through 5, it is preferred that the cylindrical side plate 11*b* be formed of a material whose acoustic impedance is greater than that of the top plate 11*a* for reason of attainment of reduction of reverberation time. Illustrative of suitable material for the side plate 11*b* are plastics, metals and ceramics. When both of the top and side plates of the oscillation housing are formed of a porous plastic material, the oscillation at the side of the oscillation housing 11 is not completely damped and the reverberation time cannot be reduced below a certain limit. In contrast, when the side plate 11*b* is formed of a material whose acoustic impedance is greater than that of the top plate 11*a* which is formed of a porous plastic material, the oscillation of the top plate 11*a* is reflected and dispersed at the interface between the top plate 11*a* and the side plate 11*b* and is prevented from propagating to the side plate 11*b*. As a consequence, the reverberation time becomes shorter as compared with the transducer in which the oscillation housing is entirely formed of a porous plastic material.

Figure 6:
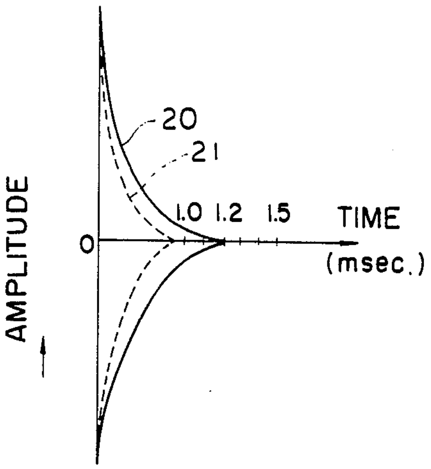
FIG. 6 is a graph showing the pulse characteristics.

For example, the ultrasonic transducer whose oscillation housing is formed of a porous plastic material having an acoustic impedance of $1\times3000$ g/cm$^2$sec shows a wave transmitting pulse characteristic as shown by line 20 in FIG. 6. On the other hand, when the oscillation housing is constituted from a cylindrical side plate formed of a stainless steel having an acoustic impedance of $7.8\times5000$ g/cm$^2$sec and a top plate formed of the porous plastic material with $1\times3000$ g/cm$^2$sec of an acoustic impedance, the transducer shows the pulse characteristic as shown by the dotted line 21 in FIG. 6. That is, the reverberation time can be reduced to below 1.0 msec.

Figure 7:
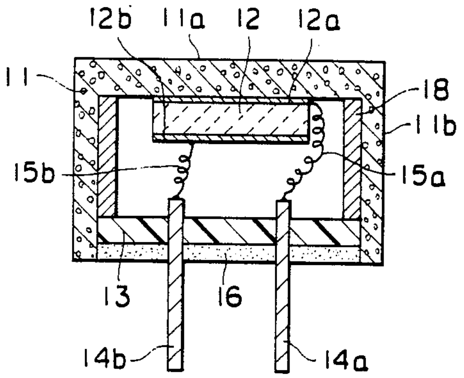
FIG. 7 is a cross-sectional, elevational view similar to FIG. 2 diagrammatically showing a further embodiment of the present invention.
Figure 8:
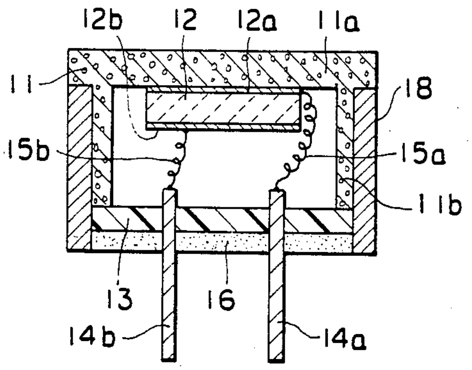
FIG. 8 is a view similar to FIG. 7 showing a further embodiment of the present invention.
Figure 9:
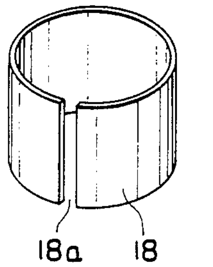
FIG. 9 is a perspective view schematically showing an elastic metal tube to be inserted into the oscillation housing for reducing the reverberation time.

Such a reduction in reverberation time (or pulse fall time) may also be accomplished by integrally providing tubular member or members on the outer and/or inner periphery of the cylindrical side plate of the transducer shown in FIGS. 1 and 2, the tubular member having a higher acoustic impedance than the cylindrical side plate. Referring to FIG. 7, a tubular member 18 is provided inside of an oscillation housing and bonded to the inner periphery of its cylindrical side plate 11*b*. In an alternate embodiment shown in FIG. 8, the tubular member 18 is bonded to the outer periphery of the side plate 11*b*. By the provision of the tubular member 18, the oscillation damping effect at the side of the oscillation housing is improved to reduce the reverberation time. The fixation of the tubular member 18 to the side plate 11*b* may be effected by any known means such as adhesives. When the tubular member 18 is provided inside of the housing 11, it is convenient to form the tubular member into an elastic tube, generally a metal tube having a slit 18*a* extending in parallel with the axis of the tube. The tube 18 has a larger outer diameter than the inner diameter of the side plate 11*b* in a free state. By fitting the tube 18 within the housing, the tube 18 is in pressure contact with the inside surface of the cylindrical side plate 11*b*. Similarly, when the tubular member 18 is provided outside of the housing 11, it is possible to use an elastic tube such as a rubber tube having a smaller inner diameter than the outer diameter of the cylindrical side plate 11*b*. By fitting the rubber tube 18 around the periphery of the side plate 11*b*, the tube is maintained in pressure contact with the side plate 11*b*. When the elastic tubular member is used, it is not necessary for the tubular member to be formed of a material with a greater acoustic impedance than the side plate 11*b*, because the side plate 11*b* is always subjected to forces in the direction perpendicular to the axis of the cylindrical side plate 11*b* and prevented from oscillating.

FIGS. 10 through 13 depict improvements of the ultrasonic transducers of the foregoing embodiments, wherein the thickness of the top plate 11*a* is abruptly changed at an annular portion adjacent to the outer periphery of a piezoelectric disc 12 to absorb or relax the transverse vibration emanated from the periphery of the piezoelectric disc 12.

Figure 14:
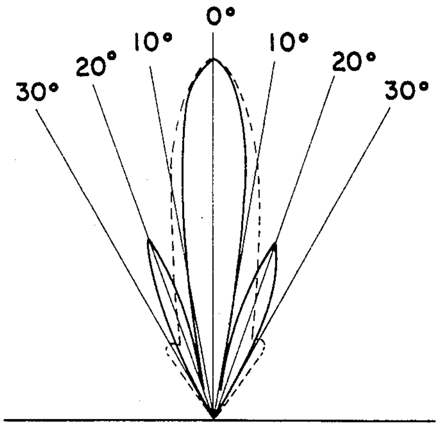
FIG. 14 is directivity patterns of the ultrasonic transducers according to the present invention.

In the embodiment of FIGS. 1 and 2, when the central portion of the top plate 11*a* oscillates, the peripheral portion of the top plate 11*a* is also caused to vibrate with an inverted phase by the oscillation transversely emanated from the outer periphery of the piezoelectric disc 12. Therefore, as shown by the solid line in FIG. 14, the directivity pattern of the transducer has two relatively large side lobes in addition to the main lobe. Due to such directivity characteristics, the transducer is apt to receive a noise generated from the direction other than the direction of the orientation of the main lobe. By changing the thickness of the top plate 11*a* at an annular position adjacent to the outer periphery of the piezoelectric disc 12, the transverse vibration may be absorbed or relaxed at that position so that the transducer may have such directivity pattern as shown by the dotted line in FIG. 14.

Figure 10:
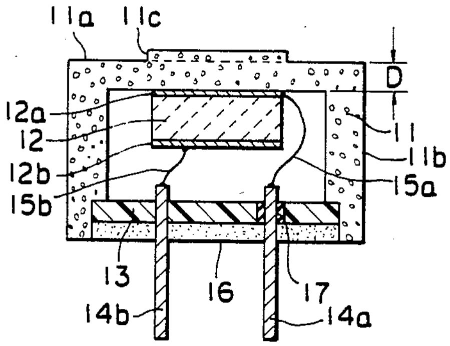
FIG. 10 is a cross-sectional, elevational view similar to FIG. 2 diagrammatically showing a further embodiment of the present invention.
Figure 11:
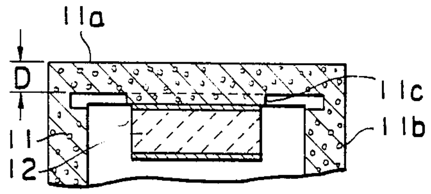
FIGS. 11 through 13 are fragmentary cross-sections diagrammatically showing alternate embodiments of FIG. 10.
Figure 12:
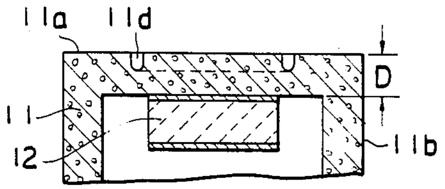
Figure 13:
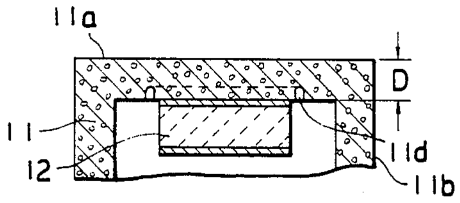

In the embodiment shown FIG. 10, the absorption or relaxation of the transverse wave emanated from the piezoelectric disc 12 may be effected by the raised or stepped portion 11*c* provided on the outer surface of the top plate 11*a*. In an alternative, the similar effect may be obtainable by providing such a raised portion 11*c* on the inside of the top plate 11*a* as shown in FIG. 11. In the embodiment shown in FIG. 12, the top plate 11*a* has an annular groove 11*d* at a location adjacent to the outer periphery of the disc 12. The annular groove 11*d* may be formed at least one of the outer surface (FIG. 12) and inside surface (FIG. 13) of the top plate 11*a*. The cross-section of the annular groove 11*d* may be U-shaped, curved (e.g. semicircular) or trapezoidal (e.g. wedge-shaped). It is preferred that the height of the raised portion 11*c* and the depth of the annular groove 11*d* be not greater than one third of the thickness D of the top plate 11*a* in order to prevent the reduction in responsibility.

We claim:

1. An ultrasonic transducer comprising:

an oscillation housing member having a cylindrical side plate and a wave transmitting and receiving top plate provided at one end of said side plate;

a piezoelectric element integrally bonded to the inside wall of said top plate; and electrodes arranged on said piezoelectric element so that ultrasonic waves may be generated from said top plate when an electric field is applied to said electrodes and/or an electric output is delivered from said electrodes when said top plate receives ultrasonic waves, said top plate being formed of a porous plastic material.

2. An ultrasonic transducer as set forth in claim 1, wherein said cylindrical side plate is formed of a material whose acoustic impedance is greater than that of said top plate.

3. An ultrasonic transducer as set forth in claim 1, wherein said cylindrical side plate is also formed of a porous plastic material.

4. An ultrasonic transducer as set forth in claim 3, further comprising a tubular member formed of a material whose acoustic impedance is greater than that of said cylindrical side plate and provided on at least one of the inner and outer peripheral surfaces of said cylindrical side plate for reducing the reverberation time.

5. An ultrasonic transducer as set forth in claim 4, wherein said tubular member is an elastic tube which has an inner diameter smaller than the outer diameter of said cylindrical side plate and which is provided outside of said cylindrical side plate for pressure contact therewith.

6. An ultrasonic transducer as set forth in claim 4, wherein said tubular member is a metal tube which is provided with a slit in a direction parallel with the axis thereof, which has an outer diameter greater than an inner diameter of said cylindrical side plate and which is provided inside of said side plate for pressure contact therewith.

7. An ultrasonic transducer as set forth in any one of claims 1 through 4, wherein said piezoelectric element is in the form of a disc plate and located concentrically on said top plate and wherein said top plate has an annular portion which is positioned adjacent to and along the outer periphery of said piezoelectric element and at which the thickness of said top plate is abruptly changed so that the vibration transversely emanated from the periphery of said piezoelectric element may be absorbed of relaxed at said annular portion.

8. An ultrasonic transducer as set forth in claim 7, wherein said annular portion is a boundary of a raised portion provided on at least one of the outer and inner surfaces of said top plate.

9. An ultrasonic transducer as set forth in claim 7, wherein said annular portion is an annular groove provided at least one of the outer and inner surfaces of said top plate.

* * * * *